(12) United States Patent
Geng et al.

(10) Patent No.: US 12,666,574 B2
(45) Date of Patent: Jun. 23, 2026

(54) MULTILAYER BACK PLATE WITH MOLDED CERAMIC LAYER

(71) Applicant: Intel Corporation, Santa Clara, CA (US)

(72) Inventors: Phil Geng, Washougal, WA (US); Ralph V. Miele, Hillsboro, OR (US); David Shia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 17/697,894

(22) Filed: Mar. 17, 2022

(65) Prior Publication Data

US 2022/0210950 A1 Jun. 30, 2022

(51) Int. Cl.
| | |
|---|---|
| *H05K 7/20* | (2006.01) |
| *H05K 1/18* | (2026.01) |
| *H10W 40/60* | (2026.01) |

(52) U.S. Cl.
CPC ...... *H05K 7/20509* (2013.01); *H10W 40/611* (2026.01); *H05K 1/18* (2013.01); *H05K 2201/10545* (2013.01); *H10W 40/60* (2026.01); *H10W 40/625* (2026.01)

(58) Field of Classification Search
None
See application file for complete search history.

(56) References Cited

U.S. PATENT DOCUMENTS

| | | | | |
|---|---|---|---|---|
| 7,268,002 | B2 * | 9/2007 | Koide | H10W 44/601 |
| | | | | 257/E23.079 |
| 9,247,633 | B2 * | 1/2016 | Hirai | H05K 7/06 |
| 9,271,388 | B2 * | 2/2016 | Hsu | H05K 1/0206 |
| 10,616,993 | B1 * | 4/2020 | Gawlowski | H05K 1/0204 |
| 12,069,804 | B2 * | 8/2024 | Kwak | H04M 1/02 |
| 12,308,543 | B2 * | 5/2025 | Edwards, Jr. | H01R 12/7064 |
| 2002/0149098 | A1 * | 10/2002 | Seyama | H05K 1/141 |
| | | | | 257/E25.011 |
| 2006/0063303 | A1 * | 3/2006 | Koide | H10W 44/601 |
| | | | | 257/E23.079 |
| 2010/0084755 | A1 * | 4/2010 | Gerber | B23K 1/0016 |
| | | | | 257/E21.705 |
| 2021/0223524 | A1 * | 7/2021 | Lee | G02B 19/0009 |

* cited by examiner

*Primary Examiner* — Nishath Yasmeen
(74) *Attorney, Agent, or Firm* — Compass IP Law PC

(57) ABSTRACT

A molded ceramic layer of a multilayer cooling assembly back plate is described. The molded ceramic layer has an opening on a side of the molded ceramic layer that is to face a back side of a circuit board. The opening is aligned with a location of a back side component on the back side of the circuit board.

20 Claims, 8 Drawing Sheets

↑
‡
‡
‡
‡
‡
‡
‡
‡ toward printed circuit board and bolster plate toward printed circuit board and bolster plate material that is less stiff or more stiff than the ceramic 202 ceramic 201

Fig. 5a
Fig. 5b
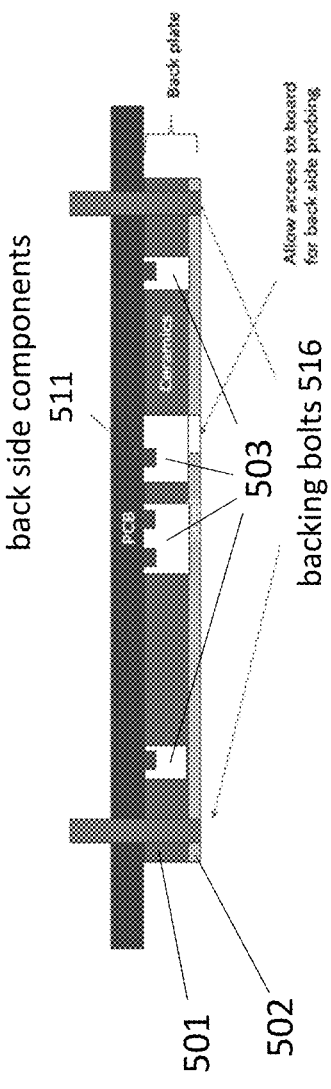
back side components
511
503
backing bolts 516
Back plate
Allow access to board for back side probing
501
502
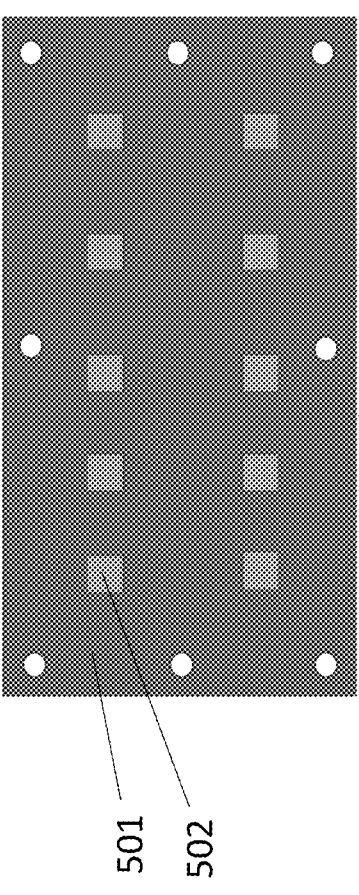
501
502

MULTILAYER BACK PLATE WITH MOLDED CERAMIC LAYER

BACKGROUND

Thermal engineers face challenges, especially with respect to high performance data center computing, as both computers and networks continue to pack higher and higher levels of performance into smaller and smaller packages. Creative cooling solutions are therefore being designed to keep pace with the thermal requirements of such aggressively designed systems.

FIGURES

FIG. 1 shows a cooling assembly (prior art);

FIGS. 2*a* and 2*b* depict a multilayer cold plate;

FIGS. 3*a* and 3*b* show ceramic layers of multilayer cold plates;

FIGS. 4*a* and 4*b* show a first embodiment of a multilayer cold plate having a molded ceramic layer;

FIGS. 5*a* and 5*b* show a first embodiment of a multilayer cold plate having a molded ceramic layer;

DETAILED DESCRIPTION

Figure 1:
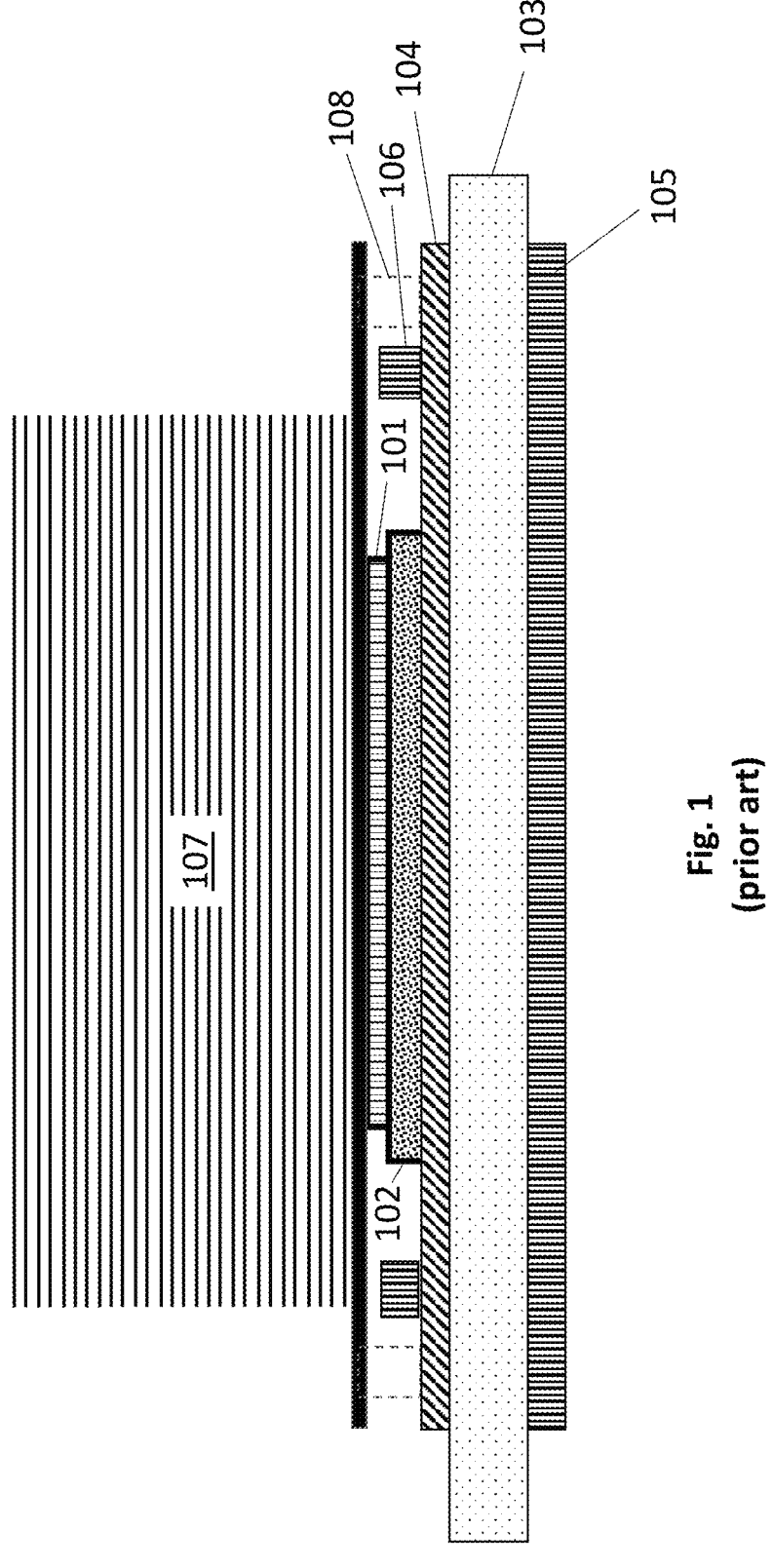

FIG. 1 depicts a side view of a prior art land grid array (LGA) semiconductor chip package 101 and its corresponding cooling assembly. As observed in FIG. 1, a semiconductor chip package 101 is inserted into an LGA socket 102. The socket 102 is mounted to a printed circuit board 103. Here, a solder ball array forms the inputs/outputs (I/Os) between the socket 102 and printed circuit board 103, whereas, a land grid array forms the I/Os between the socket 102 and the underside of the chip package 101.

In FIG. 1, the solder ball I/Os are hidden behind a bolster plate 104 whereas the land grid array I/Os are hidden behind both the bolster plate 104 and the socket 102. The bolster plate 104 is a window-frame like structure with the socket 102 located within the window opening (the window opening is visible from a top-down view but not the side view of FIG. 1). The bolster plate 104 is rigidly secured to a back plate 105 by way of tightened backing bolts 106 that run through holes in the printed circuit board 103 (the back plate 105 faces the "back side" of the printed circuit board 103 which is the side of the circuit board that is opposite the side where the LGA socket 102 is mounted). A heat sink 107 is secured to the bolster plate with spring loaded fixturing elements 108.

The rigid securing of the bolster plate 104 to the back plate 105 re-enforces the printed circuit board 103 which by itself would warp or bend in response to the loading forces applied by the spring loaded fixturing elements 108.

Here, the LGA I/Os on the bottom of the semiconductor chip package 101 are small fingers of metal that are compressed when the chip package is inserted into the socket 102. The compression of the spring-like fingers results in the chip package 101 having a propensity to "pop out" of the socket 102. The loading forces applied by the spring loaded fixturing elements 108 are designed, at least in part, to overcome these forces.

A problem is the cooling assembly's ability to handle the higher loading forces associated with future semiconductor chip technologies. Future semiconductor chip packages will possess more LGA I/Os which will cause the semiconductor chip package to exhibit stronger "push-back" against the bottom of the heat sink. The loading forces applied by the spring loaded fixturing elements will likewise need to increase to counteract the increased push-back. Unfortunately, the increased loading forces could become so large that the bolster plate and/or back plate could bend or warp in response.

One solution is to increase the stiffness of the back plate. For a particular material, such as steel, the stiffness of the back plate can be increased by increasing the thickness of the back plate. Unfortunately, for common back plate materials (steel), the thickness needed to achieve the desired stiffness is too large to accommodate future cooling assembly implementations. For example, a presently used 2.2 mm thick steel back plate would need to have its thickness increased to 2.5 mm to reach the desired stiffness of a next generation semiconductor chip package. However, there is not enough spacing/tolerance in the mechanical design of the larger system that the cooling system is integrated into to accommodate this increase.

Figures 2A, 2B:
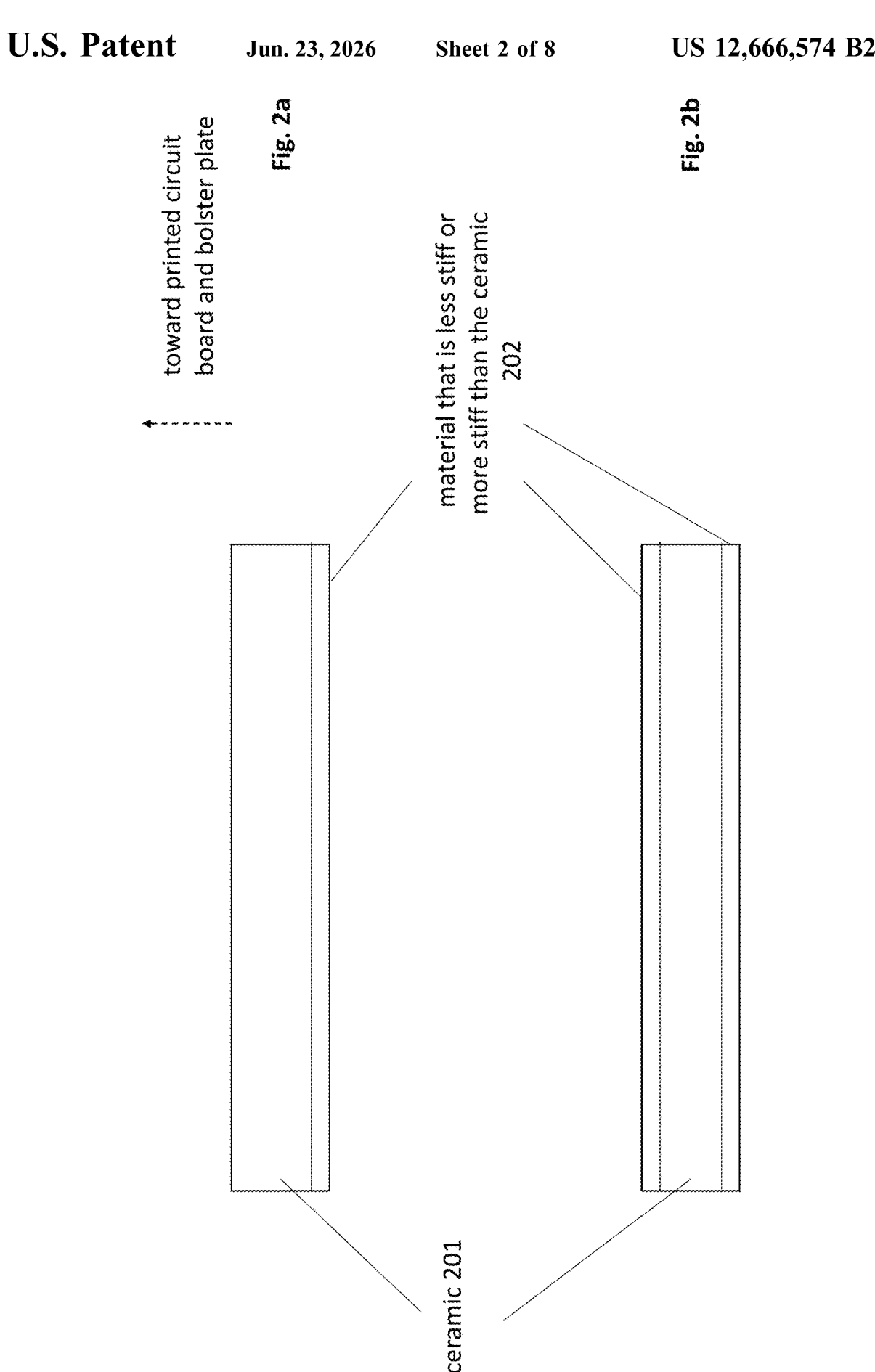

A solution is a multilayer back plate approach as observed in FIGS. 2*a* and 2*b* that uses a material 201 that is stiffer than steel as the back plate's primary material 201. A second material 202 can be added as a single layer (FIG. 2*a*) or double layer (FIG. 2*b*) to strike the appropriate balance between desired back plate stiffness and cost for a particular application.

Here, the stiffness of steel (Young's modulus of elasticity) is approximately 200 Gigapascals (GPa). By contrast, constructing a multilayer back plate (as in FIG. 2*a* or 2*b*) whose primary material 201 has a Young's modulus within a range of 300-500 GPa can yield a back plate with considerably higher stiffness than a steel back plate for a same back plate thickness (e.g., 2.2 mm). Apart from higher stiffness, cost is also a matter of concern (the cost of a material tends to scale with its stiffness).

As such, the additional layer(s) 202 can be used to reduce the cost of the back plate (at the expense of stiffness) by incorporating cheaper/softer materials, or, increase the hardness of the back plate (and likewise the cost) by incorporating more expensive and harder materials. Thus, an entire spectrum of back plates can be designed that strike a balance between cost and stiffness over a wide range.

In various embodiments, a ceramic is used as the primary material 201 because various ceramics are not overly expensive and exhibit a Young's modulus within a range of 300-500 GPa (thereby providing the appropriate boost in overall back plate stiffness as compared to a steel back plate). Ceramic materials are typically non-metallic oxides, nitrides or carbides. Some examples of ceramics (and their corresponding Young's modulus) include alumina (275-380 (GPa)), silicon carbide (300-483 (GPa)) and silicon nitride (300 (GPa)), boron carbide (445 GPa), boron nitride (675 GPa), tungsten carbide (480-640 GPa).

The additional layer(s) 202 are then used to strike a more precise balance between cost and stiffness depending on application. For applications that desire a cheaper solution and do not require the stiffness of the primary material, one additional layer 202 (FIG. 2*a*) or two additional layers 202 (FIG. 2*b*) of cheaper/softer material (e.g., steel, plastic) can be added to the multilayer back plate to reduce its cost at the expense of stiffness. The addition of two such layers 202 (FIG. 2*b*) reduces the cost and stiffness of the back plate more than the additional of only one such layer (FIG. 2*a*).

As just one example, as compared to a prior art 2.2 mm thick back plate composed entirely of steel having a cost "C", a multilayer back plate designed according to FIG. 2a having a 1.8 mm layer of 323 GPa alumina as its primary material 201 and a single 0.4 mm layer of steel as the additional layer 202, yields a 2.2 mm back plate having an overall Young's modulus of 300 GPa and a cost of (0.81 (ΔP)+0.19)C where AP is the factored difference in price between alumina and steel.

With respect to thickness, both back plates have the same thickness. With respect to stiffness, the multilayer back plate demonstrates a 50% improvement in stiffness over the prior art back plate even though both back plates have the same thickness. With respect to cost, in theory, if the cost of alumina is 10% more than steel, the improved multilayer back plate is only 8% more expensive than the cost of the prior art all steel back plate.

For applications that desire even more stiffness than the enhanced stiffness provided by the ceramic core 201, the additional layer(s) 202 can be used for materials having even higher stiffness. For example, certain $6^{th}$ row transition metals exhibit very high Young's modulus values. Examples include Tungsten (405 (GPa)), Rhenium (469 (GPa)), Osmium (462 (GPa)), and Iridium (545 (GPa)).

For applications that desire a stiffer solution than the what the core material 201 provides, one additional layer 202 (FIG. 2a) or two additional layers 202 (FIG. 2b) of stiffer material (e.g., any of the transition metals listed above or alloys that include any of them) can be added to the multilayer back plate to increase its stiffness (possibly at the expense of increased cost). The addition of two such layers 202 (FIG. 2b) increases the stiffness of the back plate more than the additional of only one such layer (FIG. 2a). In various embodiments the additional layer(s) are bonded to the ceramic layer to form a complete multilayer back plate.

An issue with multilayer back plates as described above, however, is the milling and machining of small holes to accommodate "back side" capacitors and/or other components that are located on the same side of the circuit board ("back side") as the back plate (the circuit board can be, e.g., a printed circuit board). Here, briefly referring back to FIG. 1, various systems include such components on the underside of the circuit board.

Figure 3B:
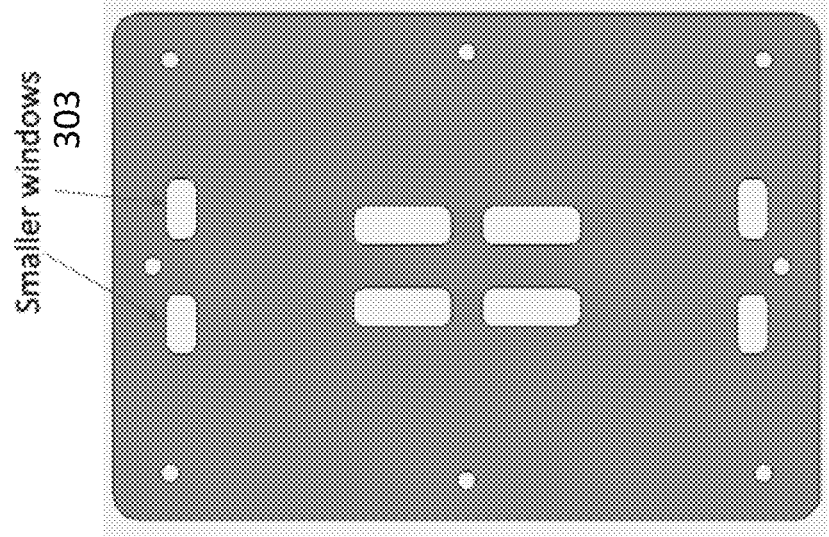
Figure 3A:
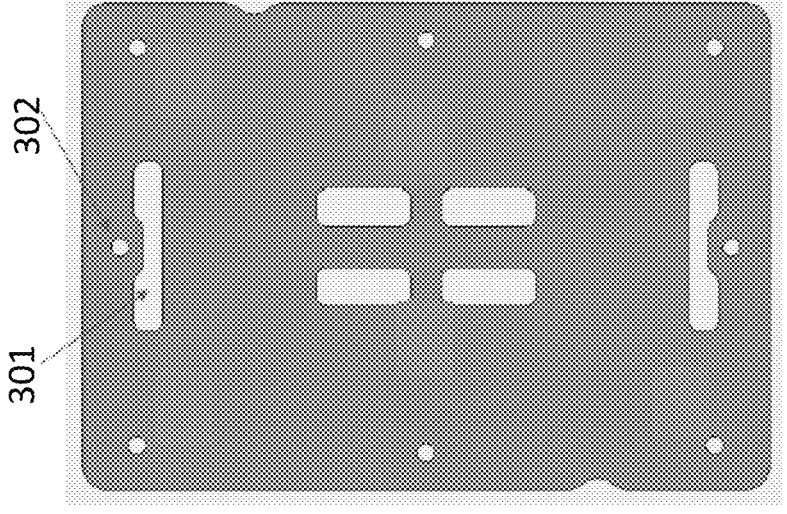

In order to accommodate such components, traditionally, large holes 301 are formed in the back plate, as observed in FIG. 3a. The presence of such large holes 301, particularly near holes 302 where back bolts are inserted to secure the back plate to the bolster plate, can structurally weaken the back plate (particularly with the higher loading forces expected of future semiconductor chip packages). Here, having extremely high loading forces applied in regions of the back plate where back plate material has been removed can cause the back plate to warp or bend an unacceptable amount.

A solution, as observed in FIG. 3b, is to reduce the size of the holes 303 used to accommodate the back side components. Unfortunately, ceramics tend to be brittle. It has been observed that drilling or otherwise machining such smaller holes 303 from a solid bulk ceramic induces cracks, fractures, or other structural defects in the ceramic material around the holes 303. Such structural defects can weaken the bolster plate to the point where it does not possess the strength to withstand the loading forces that are applied to it.

Figures 4A, 4B:
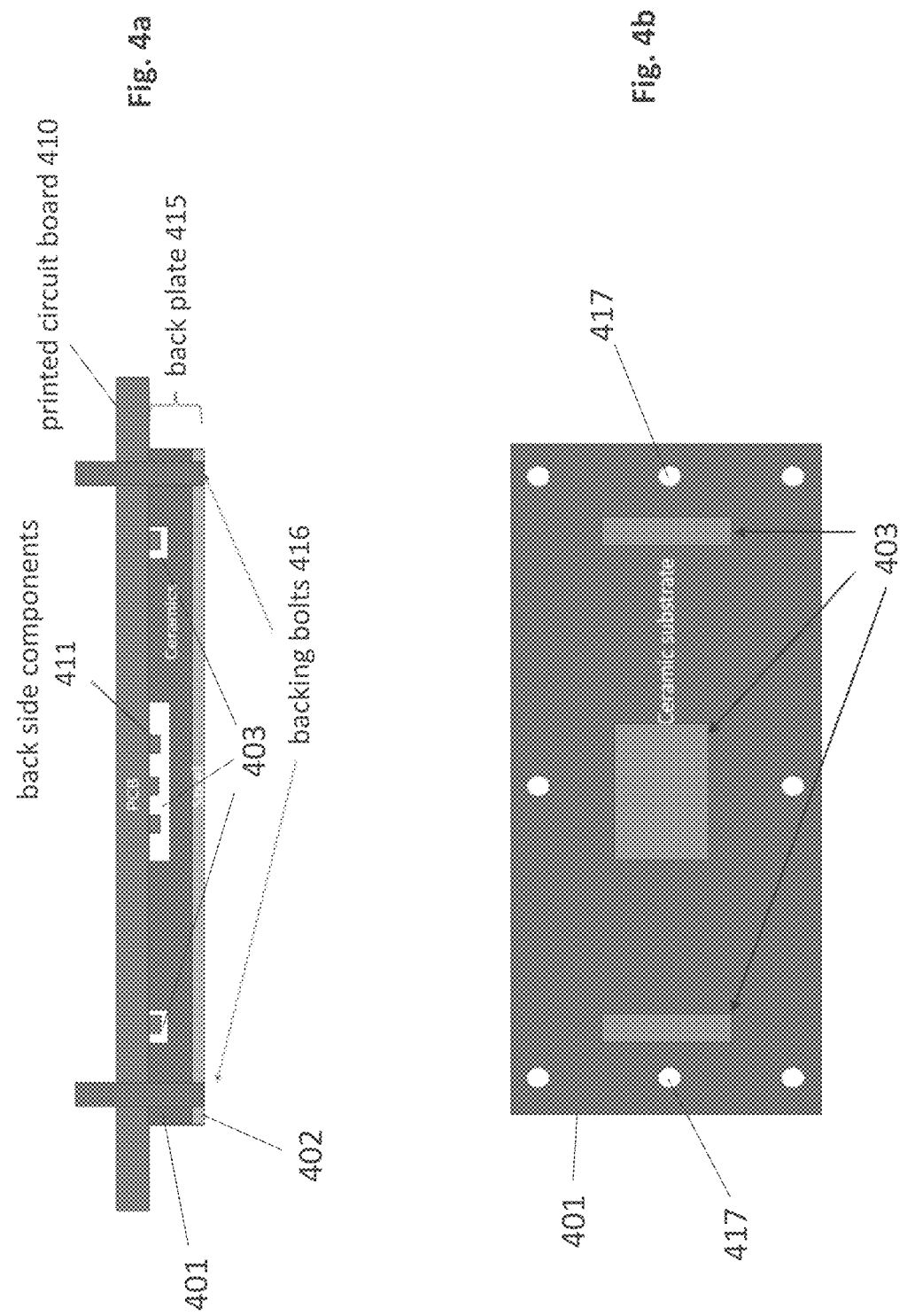

FIGS. 4a,b and 5a,b pertain to improved multilayer back plate embodiments where the holes in the ceramic layer have been formed during molding of the ceramic layer as a whole rather than drilling holes in a preformed bulk of ceramic (the holes are formed naturally by the shape of the mold during the molding of the ceramic layer).

Two improvements can be realized by molding a back plate's ceramic layer to address problems associated with the formation of special features in the ceramic layer to accommodate the existence of back side components as discussed above with respect to FIGS. 3a and 3b.

First, with a molding process, through holes need not be formed in the ceramic. Rather, mere depressions can be easily formed in the surface of the ceramic that faces the printed circuit board to accommodate the backside components (a mold can be readily formed having features that correspond to the depressions).

With a depression there remains a "floor" of ceramic material beneath the depression that helps maintain the structural integrity of the ceramic layer. That is, whereas a through hole in the ceramic completely removes all ceramic material in the area of a backside component (which in turn maximizes weakness imparted to the ceramic to accommodate the backside component), by contrast, a mere depression preserves some of the ceramic material in the area of the backside component thereby preserving at least some of the ceramic's strength.

Because, the ceramic's strength is preserved, large areas (akin to the large holes 301 of FIG. 3a) can be formed in the backplate (small features, like those 303 of FIG. 3b need not be formed to accommodate a backside component). As such, for example, more than one backside component can be accommodated with a single depression and/or manufacturing tolerances are eased (e.g., the area of a depression is large enough to accommodate back side components being placed in different locations in the cavity of the depression across circuit boards).

Second, the use of a mold avoids the use of drilling/milling/machining when small features are formed in the ceramic to accommodate a backside component (the features are formed from the mold). As such, the structural damage to the ceramic that results from drilling/milling/machining small features into the ceramic is likewise avoided.

FIGS. 4a,b pertain to the first improvement discussed above whereby mere depressions 403 are formed in the ceramic material 401 (rather than through holes). Here, FIG. 4a depicts a multilayer back plate 415 that adopts the approach of FIG. 2a. That is, the backplate is formed as a primary layer of ceramic 401 and an outer layer 402 of additional material 402 (the additional material 402 is steel in the particular embodiment of FIGS. 4a and 4b).

As observed in FIG. 4a, the multilayer back plate 415 is mounted on the underside of a circuit board 410 with backing bolts 416 that extend through the circuit board 410 and the back plate 415. As discussed above with respect to FIG. 1, typically, the backing bolts 416 secure the back plate 415 to a bolster plate (not shown in FIG. 4a) with the circuit board 410 sandwiched between the back plate 415 and bolster plate to prevent the circuit board 410 from bending under the weight and/or loading forces of the heat sink cooling assembly.

Here, backside electric components 411 are observed on the underside of the circuit board. The depressions 403 that are formed in the ceramic layer 401 during molding of the ceramic layer 401 provide sufficient room for the backside components 411 when the back plate 415 is fully mounted.

FIG. 4b shows a top down view of the ceramic layer which shows the size and shape of the depressions/cavities 403. Notably, the two depressions/cavities 403 near backing bolt holes 417 are larger (are not small). As such, the approach of FIGS. 4a,4b does not necessarily follow the approach of FIG. 3b in which small holes 303 are formed in the back plate near the backing bolt holes to keep enough ceramic material near the backing bolt holes to preserve the structural integrity of the ceramic 401.

Rather, with the depression 403 approach of FIGS. 4a,b, (and not through holes), there remains a "floor" of ceramic material beneath the depressions 403. The floor of ceramic material keeps enough ceramic material in the vicinity of the backing bolt holes 417 to maintain the structural integrity of the ceramic 401 when the back plate is fully loaded.

Here, notably, the strength that is added to the ceramic 401 by way of the floor increases with floor thickness. Thus, the more shallow the depressions 403, the stronger the ceramic material.

In cases where the vertical profile of the backside components 411 is not particularly large (the backside components 411 do not advance into the ceramic very far), the depressions 403 can be correspondingly shallow resulting in a thick cavity floor and significant strength added to the ceramic material. As a consequence, the depressions 403 can have expanded areas (are closer in area to the large hole 301 of FIG. 3a rather than the small holes 303 of FIG. 3b).

As observed in FIG. 4b, which depicts a top down view, two of the depressions 403 that are near the backing bolt holes 417 are larger and approximately correspond to the size of the drilled holes 301 in FIG. 3a. Again, the larger holes are feasible because of the floor of ceramic material that exists beneath these depressions.

FIGS. 5a,b depict another approach in which the molding process is used (by way of the features of the mold) to form small through holes 503 in the ceramic material 501. Here, with through holes 503 being formed in the ceramic 501, the top down view of FIG. 5b shows the back plate's other layer of steel 502 acting as a floor to the through holes 503. As discussed above, the approach of FIG. 5a,b is akin to the approach of FIG. 3b (formation of small features in the ceramic to accommodate the back side components).

However, unlike the approach of FIG. 3b, the small features that are formed in the ceramic 501 in FIGS. 5a,b are molded and therefore do not introduce damage to the ceramic 501 around the holes 503 as a consequence of drilling/milling/machining (which is not performed to form the small through holes).

Although the embodiments of FIGS. 4a,b and 5a,b adopt the general approach of FIG. 2a (a single additional layer on the back side of the ceramic layer) other embodiments can adopt the approach of FIG. 2b. Here, through holes are formed in the second additional layer 202 that resides between the back side of the circuit board and the ceramic layer to accommodate the back side components.

Note that the different respective approaches of the embodiments of FIGS. 4a,b and 5a,b (depressions vs. through holes) can be combined in a single molded ceramic layer of a multilayer backplate (the ceramic layer of a multilayer back plate has both depressions and through holes). It is also pertinent to mention that both depressions and through holes can be viewed as different kinds of "openings" on the side of the ceramic layer that faces the circuit board.

Although embodiments above have emphasized the presence of a heat sink in the cooling assembly it is conceivable that other kinds of cooling masses such as a liquid cooled cold plate or two phase cooling vapor chamber can be placed on the loading frame as described above. As such, the teachings above apply to cooling masses generally rather than only to heat sinks, specifically.

Figure 6:
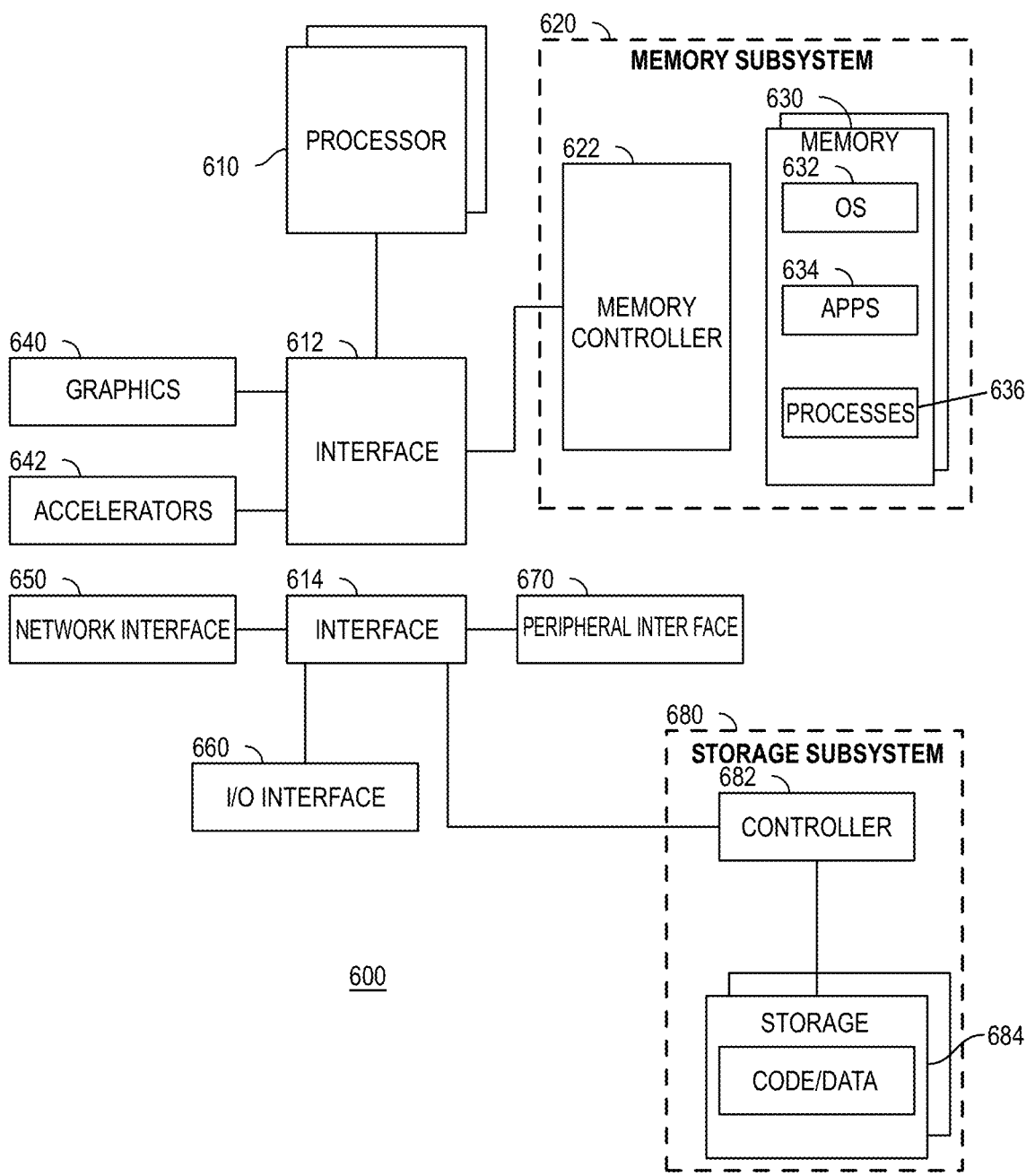
FIG. 6 shows an electronic system.
Figure 7:
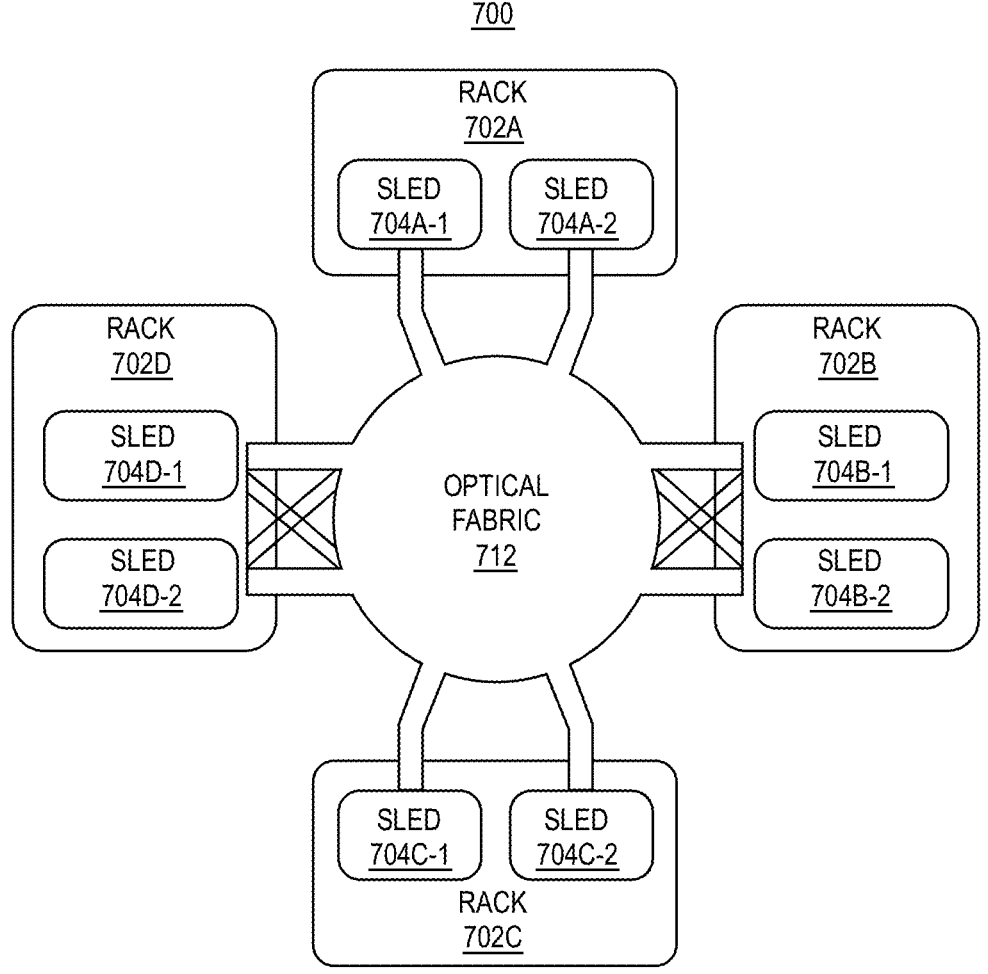
FIG. 7 shows a data center.
Figure 8:
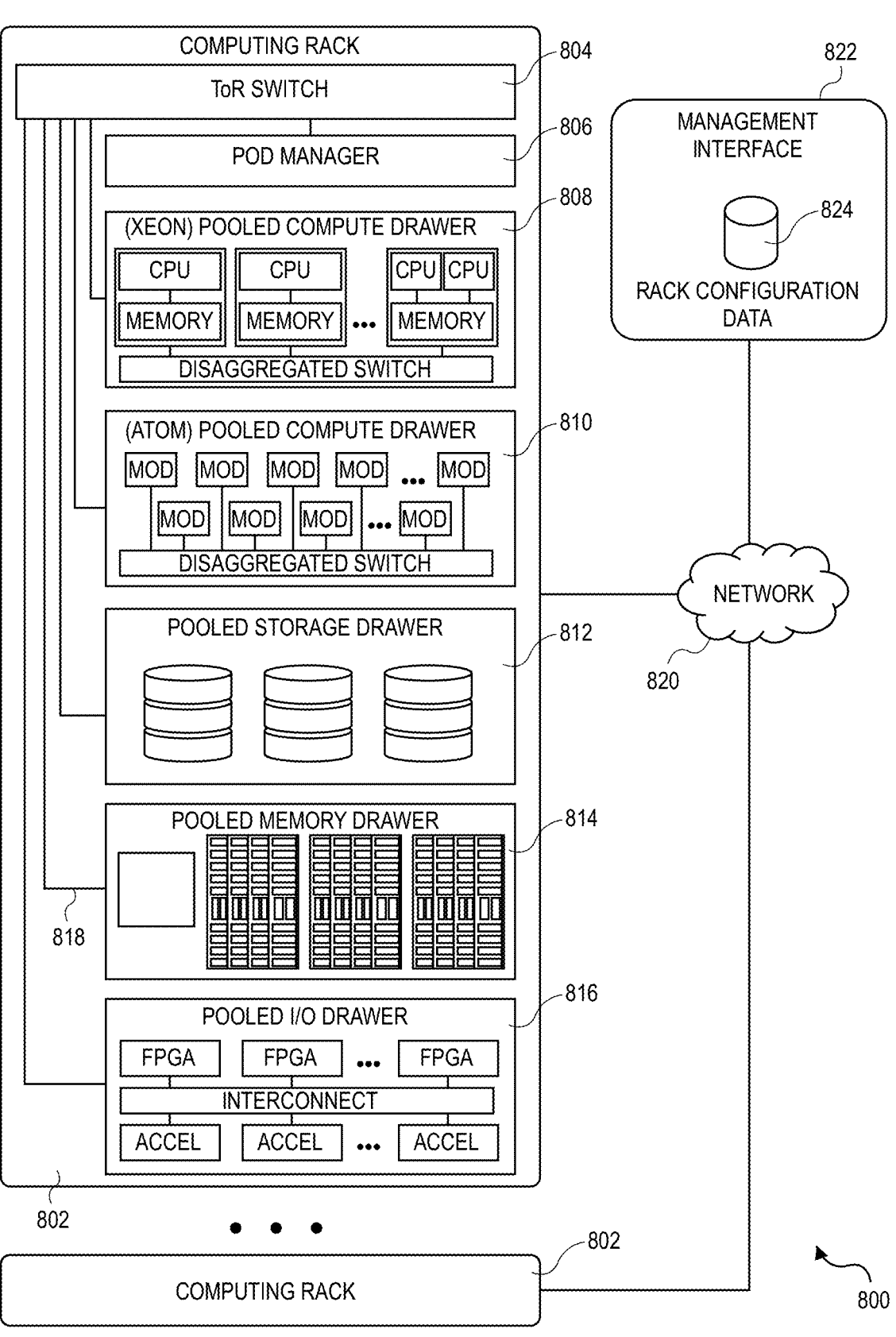
FIG. 8 shows a rack.

The following discussion concerning FIGS. 6, 7, and 8 are directed to systems, data centers and rack implementations, generally. FIG. 6 generally describes possible features of an electronic system that can include one or more semiconductor chip packages having a cooling assembly that is designed according to the teachings above. FIG. 7 describes possible features of a data center that can include such electronic systems. FIG. 8 describes possible features of a rack having one or more such electronic systems installed into it.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080 p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU).

For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

The system can also include an infrastructure processing unit (IPU) or data processing unit (DPU) to process the requests received by the system and dispatch them to an appropriate processor or accelerator within the system.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software functionality to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 600 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 6, other types of systems to which the above described invention can be applied and are also partially or wholly described by FIG. 6 are communication systems such as routers, switches, and base stations.

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks.

Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

FIG. 8 depicts an environment 800 that includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and a pooled I/O drawer 816. Each of the pooled system drawers is connected to ToR switch 804 via a high-speed link 818, such as a 40 Gigabit/second (Gb/s) or 100 Gb/s Ethernet link or an 100+ Gb/s Silicon Photonics (SiPh) optical link. In one embodiment high-speed link 818 comprises an 1000 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations. RSD environment 800 further includes a management interface 822 that is used to manage various aspects of the RSD environment. This includes managing rack configuration, with corresponding parameters stored as rack configuration data 824.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software, and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a molded ceramic layer of a multilayer cooling assembly back plate, the molded ceramic layer comprising an opening on a side of the molded ceramic layer that is to face a back side of a circuit board, the opening aligned with a location of a back side component on the back side of the circuit board.

2. The apparatus of claim 1 wherein the multilayer cooling assembly back plate further comprises any of:
a plastic layer;
a steel layer.

3. The apparatus of claim 1 wherein the multilayer cooling assembly back plate further comprises another layer comprising any of:
tungsten;
rhenium;
osmium;
iridium.

4. The apparatus of claim 1 wherein the molded ceramic layer comprises any of:
alumina;
silicon carbide;
silicon nitride.

5. The apparatus of claim 1 wherein the opening is a depression in the side.

6. The apparatus of claim 5 wherein a floor of the depression provides structural support to a region of the molded ceramic layer where a through hole in the molded ceramic layer exists.

7. The apparatus of claim 1 wherein the opening is a through hole.

8. An apparatus, comprising:
a multilayer back plate of a semiconductor chip cooling assembly, the multilayer back plate comprising a molded ceramic layer, the molded ceramic layer comprising an opening on a side of the molded ceramic layer that is to face a back side of a circuit board, the opening aligned with a location of a back side component on the back side of the circuit board.

9. The apparatus of claim 8 wherein the multilayer back plate further comprises any of:
a plastic layer;
a steel layer.

10. The apparatus of claim 8 wherein the multilayer back plate further comprises another layer comprising any of:
tungsten;
rhenium;
osmium;
iridium.

11. The apparatus of claim 8 wherein the molded ceramic layer comprises any of:
alumina;
silicon carbide;
silicon nitride.

12. The apparatus of claim 8 wherein the opening is a depression in the side.

13. The apparatus of claim 12 wherein a floor of the depression provides structural support to a region of the molded ceramic layer where a through hole in the molded ceramic layer exists.

14. The apparatus of claim 8 wherein the opening is a through hole.

15. An apparatus comprising, comprising:
a cooling mass;
a semiconductor chip package that is thermally coupled to the cooling mass;
a circuit board, the circuit board comprising first I/Os, the semiconductor chip package comprising second I/Os that are coupled to the first I/Os;
a bolster plate;
a multilayer back plate, the circuit board between the bolster plate and the multilayer back plate, the bolster plate secured to the multilayer back plate to structurally support the circuit board, the multilayer back plate comprising a molded ceramic layer, the molded ceramic layer comprising an opening on a side of the molded ceramic layer that faces a back side of the circuit board, the opening aligned with a location of a back side component on the back side of the circuit board.

16. The apparatus of claim 15 wherein the multilayer back plate further comprises any of:
a plastic layer;
a steel layer.

17. The apparatus of claim 15 wherein the multilayer back plate further comprises another layer comprising any of:
tungsten;
rhenium;
osmium;
iridium.

18. The apparatus of claim 15 wherein the molded ceramic layer comprises any of:
alumina;
silicon carbide;
silicon nitride.

19. The apparatus of claim 15 wherein the opening is a depression in the side.

20. The apparatus of claim 15 wherein the opening is a through hole.

\* \* \* \* \*